United States Patent
Den Toonder et al.

(10) Patent No.: US 8,367,215 B2
(45) Date of Patent: Feb. 5, 2013

(54) RADIO-FREQUENCY MICROELECTROMECHANICAL SYSTEMS AND METHOD OF MANUFACTURING SUCH SYSTEMS

(75) Inventors: Jacob M. J. Den Toonder, Eindhoven (NL); Auke R. Van Dijken, Eindhoven (NL); Theodoor G. S. M. Rijks, Eindhoven (NL); Jozef T. M. Van Beek, Rosmalen (NL)

(73) Assignee: EPCOS AG, Munich (DE)

( * ) Notice: Subject to any disclaimer, the term of this patent is extended or adjusted under 35 U.S.C. 154(b) by 878 days.

(21) Appl. No.: 10/578,027

(22) PCT Filed: Oct. 26, 2004

(86) PCT No.: PCT/IB2004/052201
§ 371 (c)(1),
(2), (4) Date: Nov. 6, 2008

(87) PCT Pub. No.: WO2005/043572
PCT Pub. Date: May 12, 2005

(65) Prior Publication Data
US 2010/0255322 A1    Oct. 7, 2010

(30) Foreign Application Priority Data
Oct. 31, 2003   (EP) ..................................... 03104044

(51) Int. Cl.
*B32B 15/00*    (2006.01)
(52) U.S. Cl. ........................................ 428/457; 156/247
(58) Field of Classification Search .................. 428/457, 428/548; 156/247; 148/440; 420/533, 542–547
See application file for complete search history.

(56) References Cited

U.S. PATENT DOCUMENTS

| 4,906,885 A * | 3/1990 | Kojima et al. ............. 310/313 B |
| 5,552,924 A | 9/1996 | Tregilgas |
| 6,261,943 B1 * | 7/2001 | Grupp ........................... 438/619 |
| 6,465,856 B2 | 10/2002 | Gulvin et al. |
| 6,791,188 B2 * | 9/2004 | Hagihara et al. .............. 257/771 |
| 2001/0012739 A1 | 8/2001 | Grube et al. |
| 2002/0185699 A1 | 12/2002 | Reid |

FOREIGN PATENT DOCUMENTS

| EP | 1 243 550 B1 | 9/2002 |
| EP | 0 712 022 B1 | 3/2003 |
| JP | 4-042834 B | 7/1992 |
| JP | 8-227041 A | 9/1996 |
| WO | WO 02/072905 A1 | 9/2002 |
| WO | WO 03/015128 A2 | 2/2003 |

OTHER PUBLICATIONS

"Aluminum and Aluminum Alloys", ASM International, 1993, p. 639.*

Zhang P., Lee: "Mechanical Tests of Free-Standing Aluminum Microbeams MEMS Application"; Mechanical Properties of Structural Films ASTM STP 1413; America Society for Testing and Materials; 2001 pp. 1-11.

* cited by examiner

*Primary Examiner* — Roy King
*Assistant Examiner* — Janelle Morillo
(74) *Attorney, Agent, or Firm* — Slater & Matsil, L.L.P.

(57) ABSTRACT

An RF MEMS device comprising one or more free-standing thin films configured for motion in response to actuation or stimulation, the one or more thin films comprising an alloy of aluminum and magnesium, and optionally one or more further materials. The resultant thin film has improved hardness and reduced creep relative to conventional thin films.

18 Claims, 7 Drawing Sheets

RADIO-FREQUENCY MICROELECTROMECHANICAL SYSTEMS AND METHOD OF MANUFACTURING SUCH SYSTEMS

This invention relates to an electronic device comprising a free-standing metal film, said metal film comprising an alloy of aluminum. It particularly relates to such devices in which the free-standing metal film is part of a micro-electromechanical system (MEMS) element.

Many MEMS structures employ alloy, rather than pure, metals for the purpose of improved mechanical or electrical properties as required by certain device specifications. In the reference Zhang, P., Lee, H. J., and Bravman, J. C., "Mechanical Tests of Free-Standing Aluminum Microbeams for MEMS Application," *Mechanical Properties of Structural Films, ASTM STP* 1413, C. Muhlstein and S. B. Brown Eds., American Society for Testing and Materials, West Conshohocken, Pa., the mechanical properties of titanium (Ti) alloy Al thin films are specifically investigated. The free-standing microbeams under investigation in this reference contain 2% of titanium in atomic percentage, and they were formed of the same dimensions and manufactured in a similar way to a comparable set of pure Al microbeams, such that their mechanical behavior could be directly compared. By comparing the mechanical test results on the alloyed samples with those of the pure Al samples, the authors demonstrate the advantages of using Ti (specifically) as an alloying material for MEMS devices.

It is a drawback of such known electronic devices, that the free-standing film of an alloy of Al and Ti turns out to be very sensitive to creep.

It is therefore an object of the invention to provide an electronic device of the kind mentioned in the opening paragraph, which is less sensitive to creep.

This object is achieved in that the film comprises an alloy of aluminum, magnesium and optionally any further elements.

The mechanical properties of the free-standing film are crucial for the proper functioning of RF MEMS devices. Its elastic modulus and residual stress determine the required actuation voltages, whereas its yield strength and creep properties largely determine the reliability of the final devices. A low value of yield strength, or a high sensitivity to creep, could cause plastic (i.e. permanent) deformation, both during processing and during operation, which would lead to a device performance that changes in time, or even to a highly deformed MEMS device that cannot be actuated properly.

Looking more closely, it has turned out that these mechanical properties (and the resulting thermo-mechanical behavior) are relevant for the devices in different stages of processing and use. First, due to extensive actuation (loading) during use, the mechanical properties may change due to relaxation/creep effects, i.e. an incorporated stress released in time by deformation.

Even more important is the behavior during processing, as extensive irreversible (plastic) deformation of the free-standing metal film parts may occur during processing. There are particularly three stages that give rise to such deformation: the provision of the film on a sacrificial layer at increased or raised temperature, which leads to stress as a consequence of differences in thermal expansion between the materials; secondly the removal of the sacrificial layers, as these layers cannot be used anymore for the release of any stress; and thirdly, the passing of the device through a reflow oven at raised temperature, giving the risk of surpassing of the yield strength.

As a consequence, it is the insight leading to the invention that both the yield strength and the creep resistance need to be sufficiently good, in order that a material is suitable for use as a free-standing film. A complicating factor therewith is the good conductivity that is required, so as to limit electrical resistances and losses.

In addition thereto, the mechanical behavior of a free-standing film cannot be expected to be the same as that of bulk material or even of a conventional thin-film on a substrate. In free-standing thin films, the grain size is typically very small and the absence of the substrate leads to both its top and bottom surfaces being unconstrained.

As was found out in the experiments leading to the invention, the Al—Mg alloys have a high yield strength and a good creep resistance, and its properties can be optimized by the provision of further alloying elements such as Cu, Mn and Si. In contrast, other well-known alloys do not provide such excellent results. For Al—Cu, the hardness increases with copper concentration, but the creep resistance decreases. For Al—Ti, the hardness and creep resistance increase with the Ti concentration. However, at low Ti concentrations (say 1 to 2%) the creep resistance is less than in pure aluminum. If the Ti concentration is too high, the electrical resistivity is thought to decrease. Alloys such as Al—Zn and Al—Li cannot be used under cleanroom conditions, and are thus unsuitable anyway.

In a preferred embodiment of the invention, the magnesium is present in an atomic weight percentage between 0.1 and 20%. Preferably the amount of magnesium is between 0.5 and 10%, most preferably in the range from 1 to 5%.

In a further embodiment the material of the free-standing film comprises a further alloying element. Therewith the mechanical and electrical properties can be further optimized. Measurements have indicated that the ternary alloys have a better electrical conductivity than the Al—Ti alloys of the prior art.

The further alloying element can be chosen of any element from the groups II, III, IV, and V of the periodic table, as well as the transition metals. Also suitable are the very small elements such as hydrogen and lithium. Particularly preferred are elements thereof in the rows of the periodic table of magnesium and calcium. Examples include Antimony, Arsenic, Barium, Beryllium, Boron, Cadmium, Calcium, Carbon, Cerium, Chromium, Cobalt, Copper, Gallium, Gold, Hydrogen, Indium, Iron, Lead, Lithium, Magnesium; Manganese, Mercury, Molybdenum, Nickel, Niobium, Palladium, Phosphorus, Scandium, Silicon, Silver, Sulphur, Tantalum, Tin, Titanium, Tungsten, Vanadium, Zinc, Zirconium.

Good results have been obtained with alloys further including copper or manganese, such as $Al_vCu_wMg_xMn_y$, $Al_vMn_wMg_x$, $Al_vSi_wMg_xCu_yNi_z$, $Al_vMg_wCu_x$, $Al_vCu_wMg_x$-$Si_y$, $Al_vZn_wMg_xCu_yCr_z$, $Al_vLi_wCu_zMg_y$. V, w, x, y and z herein indicate the relative amounts of the respective elements in the alloy. In suitable embodiments, v may be in the range from 80-99.8%, and all or any one or more of w, x, y and z may be in the range of 0.1 to 20%. Good results have been obtained in which the sum of the alloying elements from Mg, Cu and/or Mn was between 3 and 8%, and wherein the individual elements varied considerably (for copper from 0.1 to 4.4%, for magnesium from 1 to 5%). It is therewith believed that the very good results with the ternary and higher alloys will be present also in a broader range, such as that the concentration of the elements Mn and Cu varies between 0.1 and 10%.

The free-standing film may be part of an air-gapped interconnect structure in integrated circuits, and also part of RF MEMS elements. It is furthermore suitable for membranes for acoustic purposes, for volume corrections of fluid containers, for MEMS elements that are used as sensor or actuator. The free-standing films of these applications need to fulfill the requirements of good conductivity, high creep resistance, good strength, and manufacturability with sacrificial layers. First applications are considered for RF MEMS elements.

It is a further advantage of the free-standing film of the invention, that the design freedom is substantially increased. In fact, the design of the element including the free-standing beam can be separated from the processing.

It is another advantage of the free-standing film of the invention, that it is suitable for use as a layer on a substrate as well. This is preferred for reduction of layers in a device, and therewith for reduction of mask steps and costs. More importantly, the free-standing film generally has a thickness and a conductivity that makes it suitable as interconnect or for the definition of inductors. It is particularly preferred to include a MEMS element with the free-standing film of the invention into a network of passive components. The MEMS element has generally dimensions that are at least an order of magnitude larger than CMOS transistors. This difference in size does not contribute to cost-effective integration in one and the same thin-film deposited device. However, the MEMS element can well be integrated with interconnects, inductors and thin-film capacitors and the like, and therewith be processed in wafer fabs that are classified as too old-fashioned for processing of advanced integrated circuits.

A suitable inclusion of the MEMS element in the thin-film network is achieved in that the free-standing film is also used for lateral and vertical interconnects, and for the definition of inductors. A further, base metal layer then comprises a first electrode of the MEMS element, which faces the free-standing film or a second electrode connected thereto, and a first electrode of a thin-film capacitor. A sacrificial layer that is needed during processing of the free-standing film, is then only locally removed, so as to create an airgap between the first electrode and the free-standing film of the MEMS element. The same sacrificial layer or layers can be used as a dielectric for the thin film capacitor, and as a substrate for the lateral interconnect and the inductor. As the thermal expansion coefficient of Al—Mg alloys is comparable to that of pure aluminum, there is no need of modification of the sacrificial layers used. Preferred sacrificial layers include inorganic materials that are able to withstand temperatures used during reflow soldering. Examples of inorganic materials include perowskites, silicon nitride, silicon oxide, tantalum oxide and the like.

The present invention further relates to a method of manufacturing an electronic device comprising a free-standing thin film, the method comprising the steps of:
providing a top layer of material on a sacrificial release layer;
structuring said top layer to define a beam; and
removing said release layer to render said beam free-standing;
characterized in that said top layer comprises an alloy of aluminum and at least magnesium.

The release layer is beneficially patterned prior to provision of the top layer thereon. The top layer is preferably structured by means of, for example, photolithography and/or etching, for example, wet chemical etching. The release layer may be removed by means of wet or dry chemical etching. In case of dry etching, use can be made of fluorine chemistry. This allows local removal of the sacrificial layer, if an etch stop layer is provided so as to protect the substrate, which is a semiconductor substrate by preference, and most adequately a silicon substrate being high-ohmic.

The electronic device may include an RF MEMS element. For such elements it is important that it is subsequently packaged hermetically. The step of hermitically packaging the device may be achieved by means of a solder ring, and may include the steps of applying solder and then re-flowing the solder by passing the device through a re-flow oven.

These and other aspects of the invention will be apparent from, and elucidated with reference to, the embodiments described herein.

Embodiments of the present invention will now be described by way of examples only and with reference to the accompanying drawings, in which.

RF MEMS switches and capacitors are being extensively studied and developed, using different technology platforms and materials. The use of RF MEMS has some significant advantages compared with conventional technologies, for example, low insertion loss, low power consumption and good isolation. However, one of the main obstacles to successful commercialization of RF MEMS devices is their thermo-mechanical reliability.

Thermo-mechanical reliability issues in RF MEMS may show up in various ways. First, extensive irreversible (plastic) deformation of the free-standing metal film parts may occur during processing. The reason for this is the occurrence of large mechanical stresses in the film due to thermal expansion mismatch with other materials present in the structure and/or deposition stresses, exceeding the yield strength of the metal. This results in highly deformed devices. In other words, if a material is provided with a stress lower than its yield strength, it will deform, but only reversibly. After removal of the force, it will return to its original size. However, if it is provided with a stress greater than its yield strength, then a permanent or plastic deformation takes place, which changes the dimensions of the material. The hardness of the material is directly related to the yield strength.

Second, due to extensive actuation (loading) during use, the mechanical properties may change due to relaxation/creep effects, i.e. an incorporated stress released in time by deformation.

Figure 10:
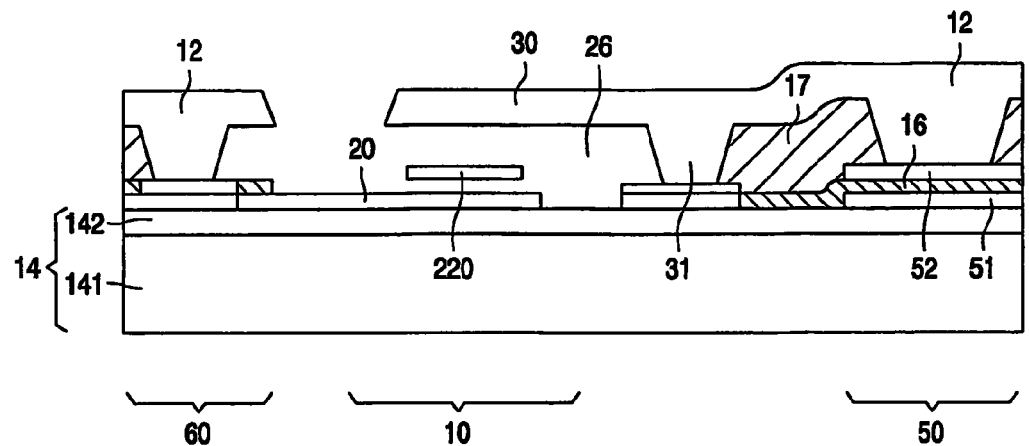
FIG. 10 shows a diagrammatical cross-sectional view of an embodiment of the device of the invention.

FIG. 10 shows diagrammatically a cross-sectional view of a device of the invention, in which the free-standing film 30, 220 is part of a MEMS element 10. The device further comprises a thin film capacitor 50 and a vertical interconnect 60. The device is present on top of a substrate 14, which comprises in this case a body 141 of Si and a thermal oxide surface 142. This Figure illustrates an advantageous embodiment in which the MEMS element having three electrodes 20, 30, 220 can be embedded in a passive network that comprises other components as well, and without the need to apply any additional metal layer, or sacrificial layer. In fact, the first sacrificial layer 16 functions also as a dielectric of the thin-film capacitor 50. The electrodes 20, 220, 30 are mutually separated by an air gap 26. The electrodes 51,52 of the thin-film capacitor 50 are defined in the same metal layers as the second and the third electrode of the MEMS element 10. The mechanical layer 12 is not only second electrode 30, but also interconnect. It is herein of particular importance for the first and second sacrificial layers 16, 17 to be selectively etched away. It is therewith improved in that not just one aperture in the mechanical layer 12 is present, but a plurality of apertures; and in that the supporting structure has a substantial extension, i.e. it is primarily wall-shaped and not pillar-shaped.

Figure 11:
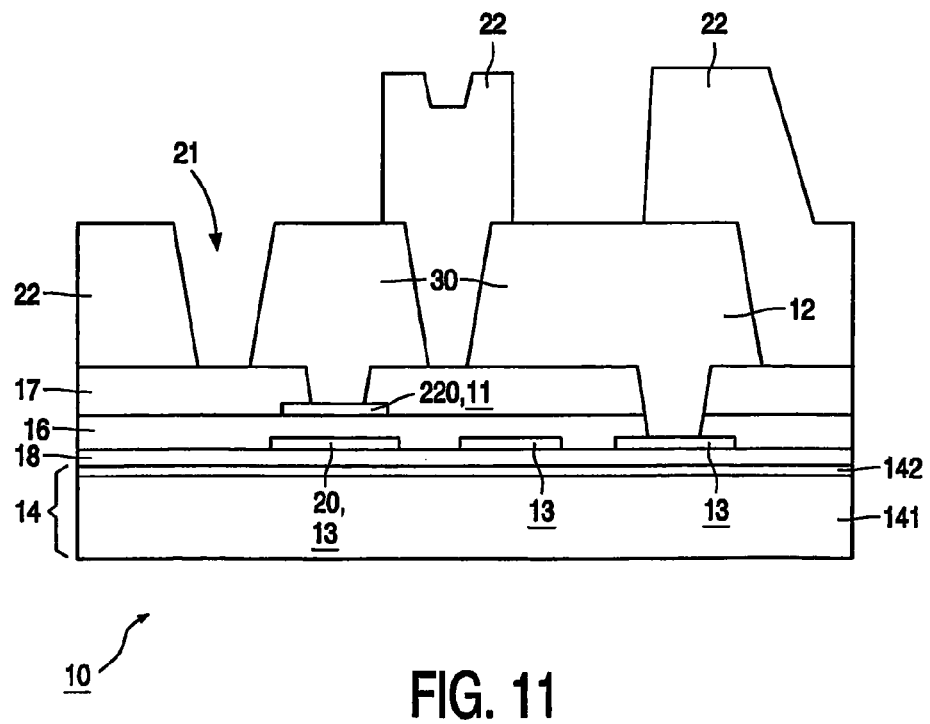
FIG. 11 shows diagrammatically a cross-sectional view of a device of the invention halfway its manufacture.

FIG. 11 shows diagrammatically a cross-sectional view of a device of the invention halfway its manufacture. In this example of processing, use is made of dry etching with a $CF_y$-plasma of sacrificial layers 16,17. An etch-stop layer 18, for instance of $Al_2O_3$, protects the surface of the substrate 14, in this case comprising a Si body 141 with a thermal oxide surface 142, against the fluorine plasma. The MEMS element includes in this case again a first electrode 20 in the base layer 13. There are further a sacrificial layer 16, an intermediate metal layer 11, and a second sacrificial layer 17, and a mechanical layer 12.

Windows in the sacrificial layers 16 and 17 have been made only after the provision of this second sacrificial layer. This is effected with reactive ion etching. The metal layers 13,11 have acted as etch-stop layers, such that at one stage the mechanical layer 12 is connected to the intermediate metal layer 11, whereas at another stage it is connected to the base layer 13.

The mechanical layer 12 is provided, by sputtering or CVD deposition of an aluminum alloy layer at enhanced temperature (say 400 degrees centigrade). This mechanical layer 12 is relatively thick, compared with the normal thickness of thin films, generally 1-10 micrometers. This layer includes any interconnects and support structures to the substrate (however, it will be appreciated that several different configurations are envisaged in this respect, and the invention is not intended to be limited in this regard). Next, the top layer 12 is structured using photolithography and etching, for example, wet chemical etching, so as to define the beam.

A mask 22 is applied on top of the mechanical layer 12. This mask 22 includes a window 21 to the sacrificial layer 17. Use is made of a polyimide with a thickness of about 5 μm. This is suitable in view of the thickness of the mechanical layer 12, for instance 1 μm, and offers sufficient protection against the fluorine plasma. Hereafter, the sacrificial layers 16,17 are locally etched, so as to create the air gap 26 (as shown in FIG. 10). The mask 22 is not removed but constitutes part of the beam structure of the MEMS element. In addition, it may act as a passivation layer for other elements in the device.

Following this, the MEMS element, and possibly the complete device, is packaged hermetically, since moisture and the like tends to have a detrimental effect on the functionality of the device. Such packaging may generally be achieved by placing a hermetic cap over the device by means of a solder ring, and implemented by providing the solder first, and thereafter reflowing the solder by passing the device through a reflow oven at about 250-300 degrees centigrade.

There are at least three stages in the process described above which may give rise to deformation of the beam. Firstly, the deposition of the top layer at an increased or raised temperature. This involves the provision of a layer on a surface, and the thermally induced expansion or contraction of the base material will tend to be different from that of the layer, which will lead to stress during the cooling stage, following deposition of the layer. Thus, it is important to a certain extent that the material used to form the layer is hard enough to prevent plastic deformation.

Secondly, the removal of the sacrificial layer: the free-standing beam (following this process step) will have different mechanical behavior from that of the beam when it is on a surface, and the stress present in the beam up to the removal of sacrificial layer is released by creep after removal of the sacrificial layer. Uncontrolled deformation may result, with corresponding electrical effects.

Thirdly, the passing of the MEMS device through the reflow oven: the increased temperature employed during this process step may give rise to deformation through the surpassing of the yield strength.

As explained above, the mechanical properties of the free-standing film are crucial for the proper functioning of RF MEMS devices. Its elastic modulus and residual stress determine the required actuation voltages, whereas its yield strength and creep properties determine to a large extent the reliability of the final devices. A low value yield strength or high sensitivity to creep could cause plastic (i.e. permanent) deformation, both during processing and during use, which would lead to a device performance which changes over time, or even to a highly deformed MEMS device that cannot be actuated properly. There are various techniques for testing the mechanical properties of free-standing thin film. Nano-indentation, bulge testing, and substrate curvature experiments can be used to estimate yield strength, elastic modulus and creep properties, whereas special mechanical test structures may be used to measure mechanical stresses.

However, although aluminum alloys may seem prima facie to comprise a class in itself, having similar properties and microstructures, this is not the case. The microstructure of different Al alloys can vary greatly, so that their mechanical properties (among others) may also vary greatly. Particularly, there are two main groups: solid solutions, in which the alloying element is more or less homogeneously distributed and incorporated in the crystal structure; and structures, wherein the intermetallic compounds are present around the grains or inside the grains of the aluminum. Combinations of these are also possible.

It is also worth noting here that the alloy must have a good electrical conductivity, so that, for example, Al—Si alloys cannot be used.

In accordance with the invention, the free-standing thin film comprises an alloy of aluminum and at least magnesium. This has been found to display significant advantages over the Al—Ti proposed in the above-mentioned reference, in that the properties (such as those relating to creep) are less sensitive as they are not dependent on variations in Ti content. Furthermore, the actual hardness and creep resistance has been found to have improved significantly.

Experiments performed in respect of various free-standing thin films will now be described and explained. In these experiments, the hardness and creep of thin films of various aluminum alloys are determined. It is important to note that the experiments relate specifically to thin films. The mechanical properties of aluminum alloys in bulk are well known in the art. However, due to the different surface/volume ratio in thin films, and further due to the large free surface area of the freestanding beam (as opposed to laminated layers having only interfaces), the mechanical properties of thin films cannot be assumed to be the same as in bulk materials.

A brief description of the techniques mentioned will now be given.

Nano-indentation

Figure 1:
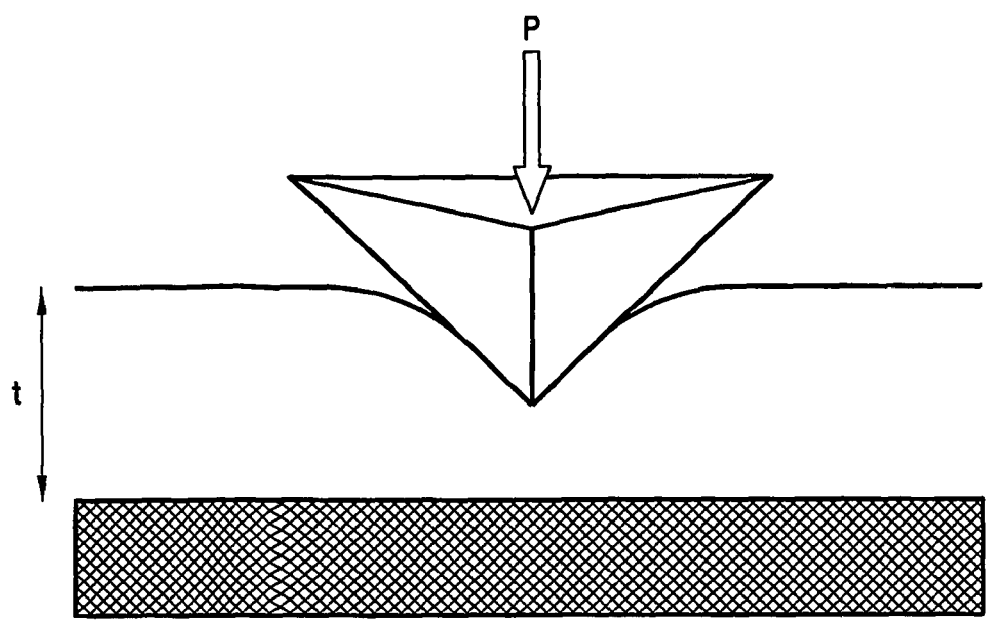
FIG. 1 is a schematic diagram illustrating the principle of nano-indentation.
Figure 2:
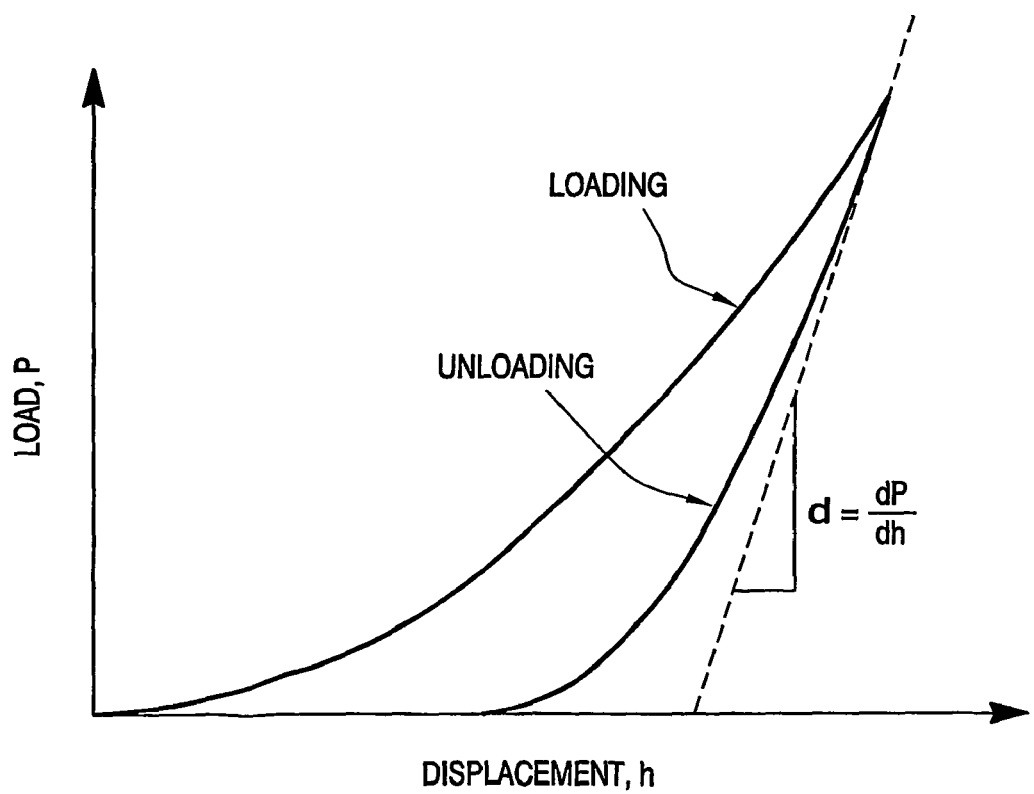
FIG. 2 is a schematic sketch of a load-displacement curve.

Nano-indentation can be used to estimate the yield strength and the (primary) creep properties of various materials used for a free-standing thin film. The principle of nano-indentation is illustrated in FIG. 1 of the drawings. A sharp diamond tip (the indenter) is pressed into the material with a certain load, while at the same time the displacement of the tip is measured. A load-unload cycle produces a load-displacement curve, as shown in FIG. 2 of the drawings. Analysis of this curve gives information about the elastic modulus, the hardness, creep properties and (for brittle materials), the fracture properties of the indented material. As stated above, the hardness is particularly relevant in the context of the present invention, because for metals it is proportional to the yield strength.

The hardness H is defined as the ratio between the maximum load P and the area of contact A between the indenter and the surface at maximum load:

$$H = P/A \quad (1)$$

The area A is obtained from the measured indentation curve, as is known in the art. In creep experiments, the maximum load is held fixed for a certain period of time (the "hold period"), during which the change in displacement gives information about creep properties. Hence a qualitative measure of creep from indentation experiments is $\Delta h$, the change in displacement during the hold period $\Delta t$.

Bulge Testing

Figure 3:
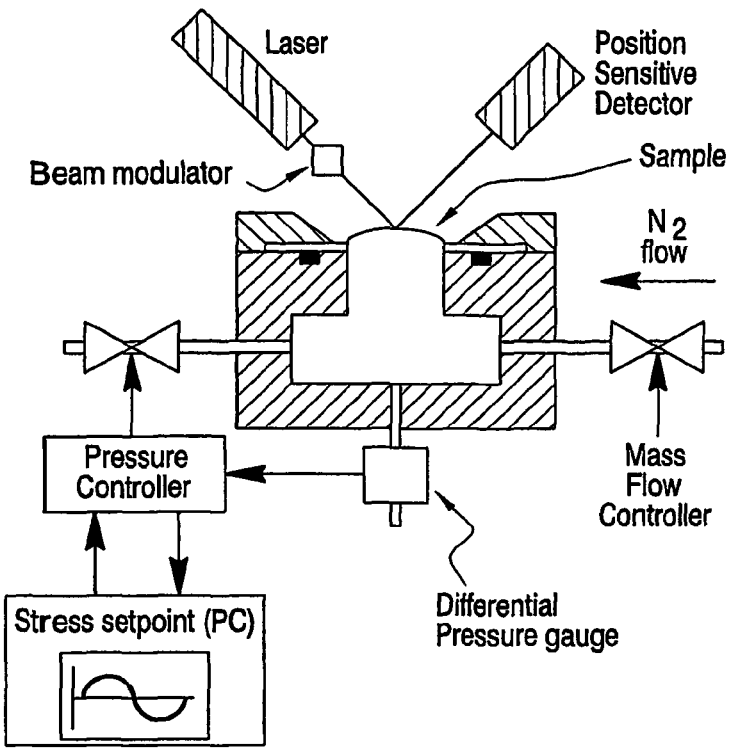
FIG. 3 is a schematic diagram illustrating the principle of the bulge test set-up.

While nano-indentation can be used to measure properties of "fixed" films, i.e. films attached to a substrate, the technique of bulge testing allows the mechanical characterization of free-standing films. The principle is shown in FIG. 3. The sample needed consists of a rectangular membrane of the film (size 16*4 mm), that is mounted in the bulge tester. A pressure is applied to this membrane, and the result is that the membrane will deform, that is it will "bulge". The maximum deflection of the membrane is determined by measuring the deflection of a laser beam reflected by the membrane. From the applied pressure P and the measured deflection $h_0$, the stress $\sigma$ and the strain $\epsilon$ can be computed with the help of the following equations, in which t is the thickness of the film, and a its (smallest) width:

$$\sigma = \frac{Pa^2}{2h_0 t} \quad (2)$$

$$\varepsilon = \frac{2h_0^2}{3a^2} \quad (3)$$

A stress-strain relation can thus be obtained, which means that it would in principle be possible to determine the elastic modulus and the yield strength from the bulge test measurement. Also, the (initial) residual stress can be determined, at least if this is a tensile stress.

Substrate Curvature Measurements

To study secondary or steady state creep properties, substrate curvature measurements can be used. These measurements are complimentary to the indentation-creep measurements that covered only the initial, primary creep. Thus, the evolution of the stress in the thin films as a function of time and temperature was measured. The most accurate and simplest way of measuring film stress is to measure substrate curvature using the laser-scanning method. This is a derivative measurement in that the measured change in displacement of the reflected laser beam is proportional to the change in the slope of the tangent line to the surface of the wafer.

Figure 4:
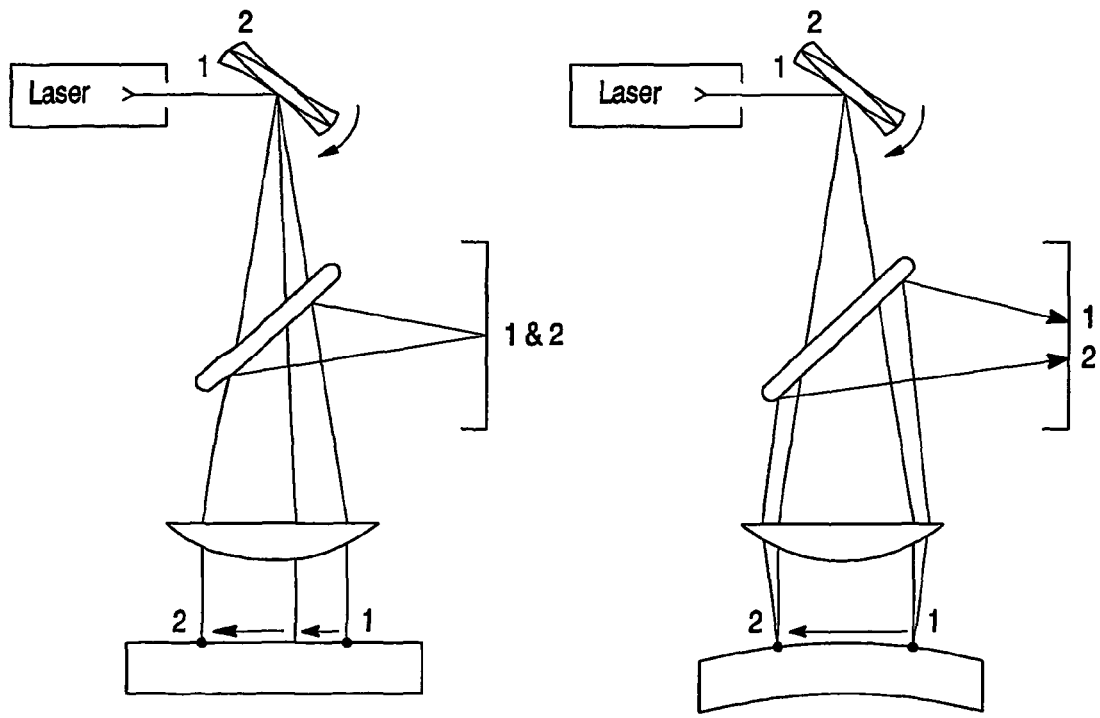
FIG. 4 is a schematic illustration of the principle of the laser-scanning method.

A beam of laser light reflects off the surface of a curved substrate at a certain angle and is detected at a certain position (FIG. 4). Upon moving the laser beam to a new position, the light reflects at a different angle and is detected at a different position on the photodecoder. The linear motion detected by the photodetector can be converted into changes in angle as a function of position on the substrate, and in turn can be used to find the curvature of the substrate.

By measuring the change in wafer curvature (slope=2/R) and using following expression (Stoney's equation) the stress in thin films can be calculated.

$$\sigma_{film} = E_{sub}/[6(1-v_{sub})] \cdot t_{sub}^2/t_{film} \cdot (1/R - 1R_0)$$

where $\sigma_{film}$ is the stress in the thin film, $E_{sub}$ and $v_{sub}$ are the modulus of elasticity and the Poisson's ratio for the substrate, $t_{sub}$ and $t_{film}$ are the substrate and film thickness, respectively, $R_0$ is the initial radius of curvature before film deposition or after film removal, R is the measured radius curvature.

In order to obtain a value for $R_0$, the sample must be measured without the thin film. For this purpose the film is removed after the experiment using a solution of $H_2O_2/H_2SO_4$ and the curvature as a function of temperature is measured again.

If during wafer curvature testing, the temperature is held constant, stress relaxation may be observed. The change in time of the radius of curvature is measured, and the evolution mechanism of stress relaxation is identical to this, causing creep.

Specimens and Materials

For nano-indentation, bulge testing, and substrate curvature testing, special samples were prepared. In case of nano-indentation and substrate curvature testing, these were uniform sputtered metal films, deposited on a film of silicon oxide or nitride on a silicon wafer. For the metal, a range of different Al-alloys was made. An overview is given in table 1 (below). For the substrate curvature measurements, only AlCu(4 wt %) and AlV(0.15 wt %)Pd(0.1 wt %) and ClCuMgMn were used.

TABLE 1

Nano-identation test specimens

| Alloy | Wt. % | Thickness [µm] |
|---|---|---|
| Al | — | 5 |
| AlCu | 4 | 5 |
| AlCu | 1 | 5 |
| AlCr | 2 (at %) | 5 |
| AlTi | 1 (at %) | 5 |
| AlVPd | 0.15 (at %)-0.1 (at %) | 5 |
| Al | — | 1 |
| AlV | 1 (at %) | 1 |
| AlTiB | 94-5-1 | 1 |
| AlMnMg | 97.8-1.2-1 (at %) | 1 |
| AlCuMgMn | 93.5-4.4-1.5-0.6 (at %) | 1 |
| AlMgCu | 94.9-5-0-1.1 (at %) | 1 |
| AlMgCuSi | 97-1-1-1 (at %) | 1 |
| AlSiMgCuNi | 85.2-12-1-0.9-0.9 (at %) | 1 |

For bulge testing, thin metal film membranes were made in the following way. A 0.5 µm Si3N4 film was deposited on both sides of a silicon wafer using PECVD. Using reactive ion etching, a rectangular region of the size of the final membrane (4*16 mm) of the nitride layer was removed from one side of the wafer. In the next step, the nitride was used as an etching mask in KOH etching of the silicon: a rectangular hole was obtained leaving on one side a nitride membrane. The metal film was sputtered on the silicon nitride membrane. Thus, a membrane consisting of two layers, namely a nitride layer and a metal layer, was obtained. The last step was to remove the nitride layer with reactive ion etching, so that a free-standing metal membrane was obtained.

A number of membranes with varying metals, all Al alloys, and thicknesses were prepared. An overview is given in table 2.

TABLE 2

Bulge test specimens

| Alloy | Wt % | Thickness [μm] |
|---|---|---|
| AlCu | 4 | 1.5 |
| Al | — | 1 |
| AlCu | 4 | 1 |
| AlCr | 2 (at %) | 1 |
| AlCu | 1 | 1 |
| Al | — | 1.5 |
| Al | — | 0.5 |
| AlCu | 1 | 1 |
| AlCu | 1 | 1.5 |
| AlCu | 1 | 0.5 |
| AlTiB | 94-5-1 | 2 |
| AlMnMg | 97.8-1.2-1 (at %) | 2 |
| AlCuMgMn | 93.5-4.4-1.5-0.6 (at %) | 2 |
| AlMgCu | 94.9-5-0.1 (at %) | 2 |
| AlMgCuSi | 97-1-1-1 (at %) | 2 |
| AlSiMgCuNi | 95.2-12-1-0.9-0.9 (at %) | 2 |

Results
Nano-Indentation

Figure 5:
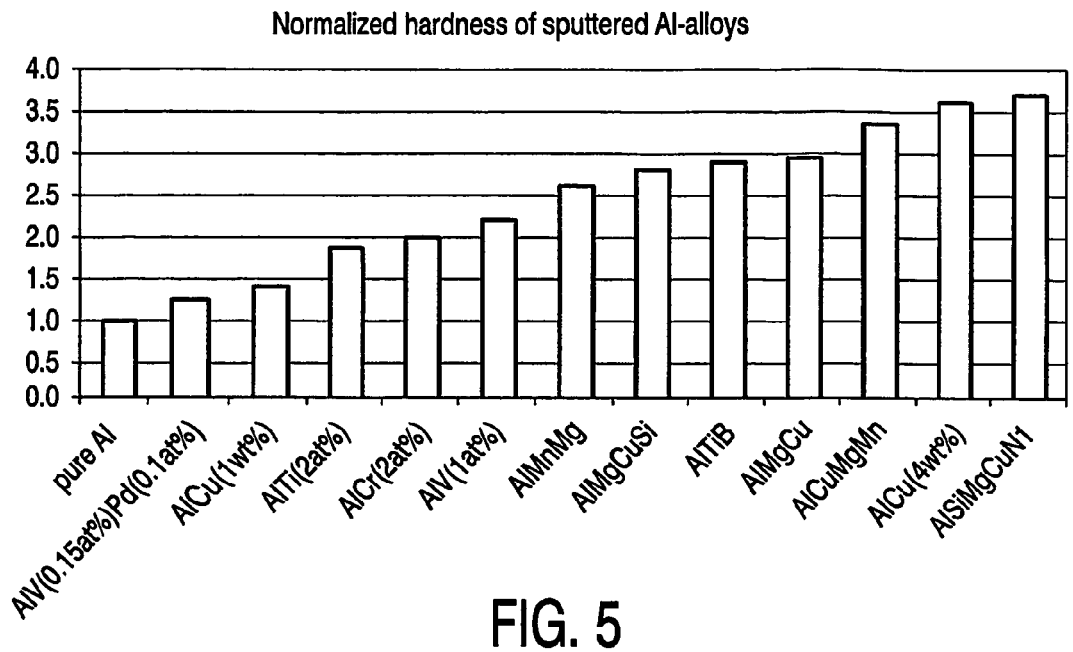
FIG. 5 is a graphical representation of the normalized hardness of various sputtered aluminum alloys, measured with nano-indentation.
Figure 6:
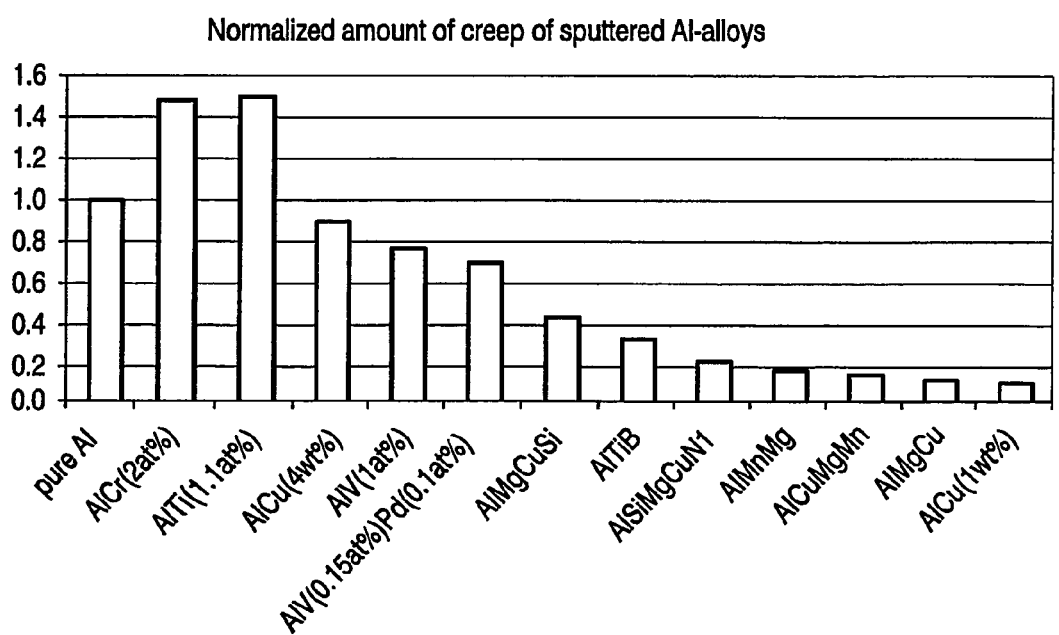
FIG. 6 is a graphical illustration of the normalized amount of creep of various sputtered aluminum alloys, measured with nano-indentation.

The results of the nano-indentation experiments are summarized in FIGS. 5 and 6. FIG. 5 depicts the measured hardness, normalized with the hardness measured for pure aluminum. The displacement during the 30 second hold period, normalized by the value for pure aluminum, is illustrated in FIG. 6. These results represent only the measurements in which the indentation depth was approximately 0.2 times the film thickness. This ensures that all measurements were equally affected by the presence of the silicon substrate, and may therefore be directly compared with one another. It is clear that all of the alloys have a larger hardness, and therefore a higher yield strength, than pure aluminum. High values are particularly found for AlCuMgMn and AlSiMgCuNi.

Figure 7:
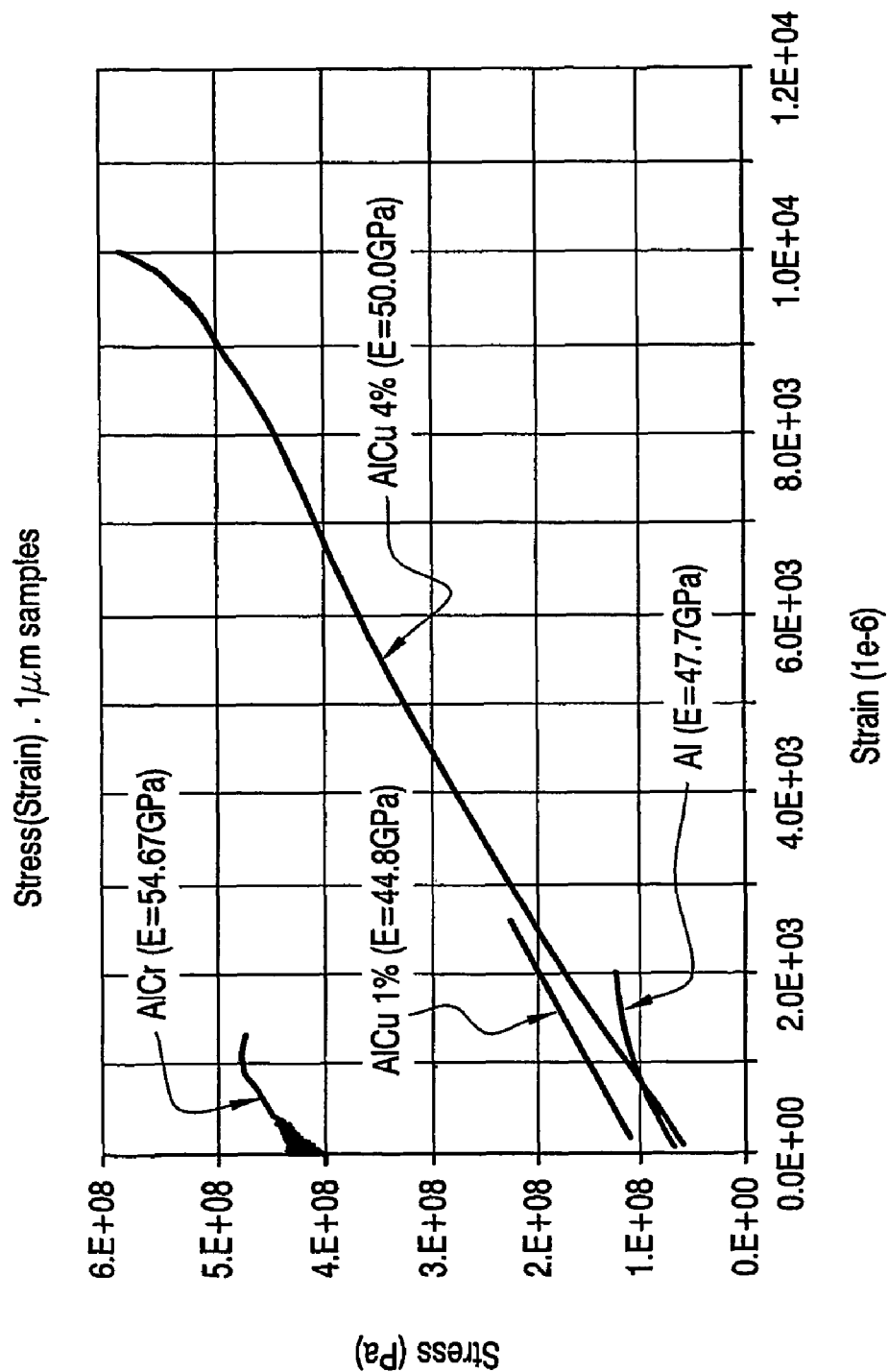
FIG. 7 is a graphical illustration of the result of bulge testing (stress-strain curves) for various 1 micrometer films.

FIG. 6 is a graphical illustration of the normalized amount of creep of various sputtered aluminum alloys, measured with nano-indentation. To be able to make mechanically stable RF MEMS devices, it is necessary to have both a high yield strength (i.e. high hardness), and low creep. FIGS. 6 and 7 show that these two properties may show opposite trends. AlCu(1 Wt %), for example, shows very little creep, but at the same time has a relatively small hardness. AlCu(4 Wt %), on the other hand, has a high hardness, but a lot of creep. AlCuMgMn and AlMgCu have both a high hardness and little creep. The reason for the opposite trends is that creep and hardness can be determined by different (micro-structural) mechanisms.

Bulge Testing

FIG. 7 summarizes the bulge test results.

FIG. 7 shows stress-strain curves until fracture of the membrane occurred, found for the 1 μm membranes. All samples have an initial tensile stress, which is different for the various samples. Remarkably, all samples show only small or no yielding, and they exhibit rather "brittle" behavior (i.e. only plastic deformation until fracture). The fracture stain is quite low compared to typical values for bulk alloys (which can range between 3 and 30%). In bulk materials, fracture is always preceded by extensive plastic deformation, which explains this difference. The ultimate strength, that is the stress at fracture, on the other hand, is relatively large for the films when compared to bulk materials. The Young's modulus computed from the curves is indicated in FIG. 7. The value is around 50 GPa, which is significantly lower than the value measured for bulk Al alloys, which is 70 GPa. For films used as the actuated layer in RF MEMS, it would be advantageous to have a stress range between the initial stress and the ultimate strength that is as large as possible. The AlCu (4 wt %) film has the largest range, as can be seen in FIG. 7. This is consistent with the large hardness value found for this alloy (see FIG. 5).

Figure 8:
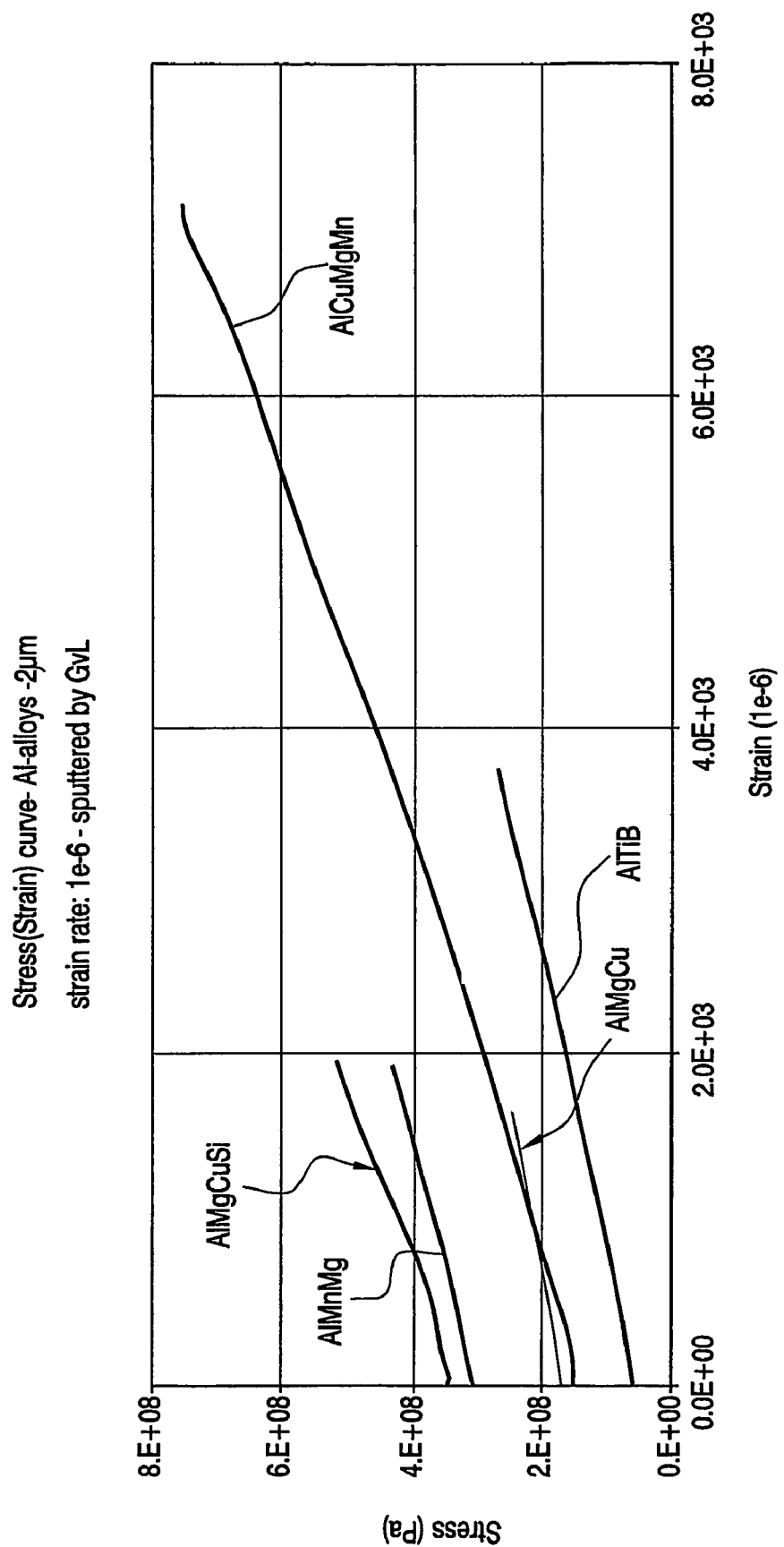
FIG. 8 is a graphical representation of the bulge test results (stress-strain curves) for 2 μm films.

FIG. 8 depicts the results for five of the 2 μm membranes.

The Young's modulus is lower than the bulk value of 70 GPa. Quite remarkable behavior is shown by AlCuMgMn, that has a very large range between the initial stress and the ultimate strength. This behavior is consistent with the high hardness and low creep as found by nano-indentation (FIGS. 5 and 6), and indicates that this alloy would be one preferred exemplary embodiment of the invention.

Wafer Curvature Testing

Figure 9:
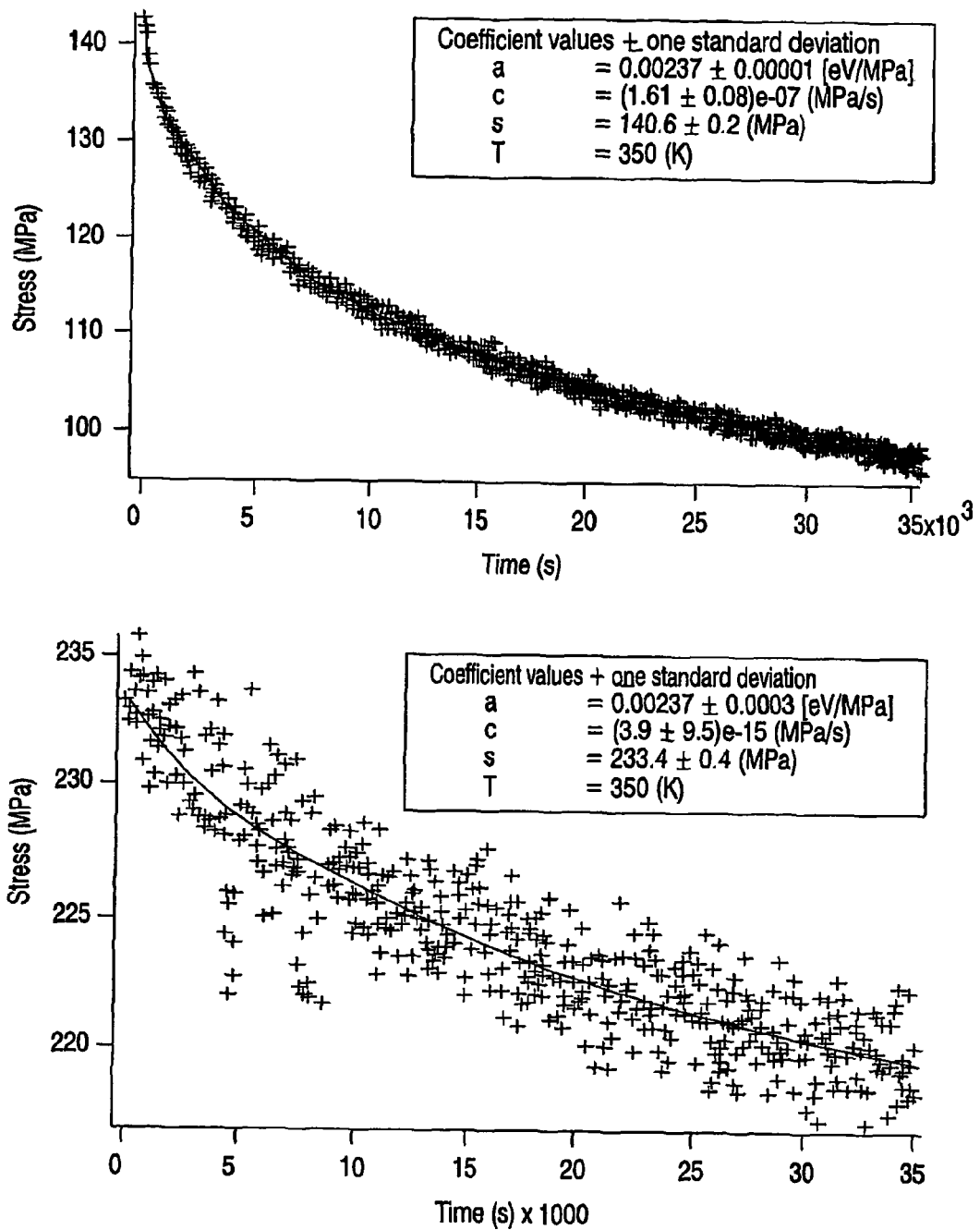
FIG. 9 is a graphical representation of the stress relaxation of an AlCu (1 wt %) film, shown in the top graph, and an AlCuMgMn film, shown in the bottom graph, as measured with wafer curvature testing. The AlCuMgMn film exhibits significantly less stress relaxation.

FIG. 9 shows results of the wafer curvature tests. The long term stress evolution in time at a temperature of 77° C. is depicted for AlCu(4 wt %) and AlCuMgMn. The stress relaxation is directly related to creep properties. The Figure shows that the long-term stress relaxation, and hence the long-term creep, is far less pronounced for the AlCuMgMn alloy than for AlCu(4 wt %). This is consistent with the nano-indentation results of FIG. 6.

Thus, in summary, the experiments described above illustrate the following:

For Al—Cu, the hardness increases with copper concentration, but the creep resistance decreases.

For Al—Ti, the hardness and creep resistance increase with Ti concentration. However, at low Ti concentrations (say 1-2%), the creep resistance is less than in pure aluminum. If the Ti concentration is too high, the electrical conductivity is thought to decrease.

Al—Zn and Al—Li cannot be used in the clean room.

The Al—Mg alloys are found to have a high yield strength and a good creep resistance, and its properties can be optimized by the provision of further alloying elements such as Cu, Mn and Si.

The electrically conductive properties of the Al—Mg alloy of the invention is clarified with respect to the known Al—Ti alloy, in the Table 3

TABLE 3 electrical resistivities for Al and selected Al alloys.

| alloy or metal | resistance (μΩ/cm) |
|---|---|
| $Al_{95}Mg_5Cu_{0.1}$ | 5.4 |
| $Al_{93.5}Cu_{4.4}Mg_{1.5}Mn_{0.6}$ | 6.8 |
| $Al_{97}Mg_1Cu_1Si_1$ | 6.2 |
| Al | 3.7 |
| $Al_{99}Cu_1$ | 4.0 |
| $Al_{96}Cu_{44}$ | 4.5 |
| $Al_{99}Ti_1$ | 11 |
| $Al_{94}Ti_5B_1$ | 17 |

As is clear from these results, the increase in conductivity of the Al—Mg alloys with respect to pure Al or AlCu alloys is relatively limited in comparison with the Al—Ti alloys. This increase in resistance of a factor two appears to be within the specifications for use in the RF MEMS devices.

It should be noted that, although the free-standing thin film of the present invention has been described specifically with reference to RF MEMS devices, it will be appreciated that they may also be suitable for other applications, for instance, airgapped interconnects in an integrated circuit.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A MEMS device comprising:
   a substrate;
   a first electrode at an upper surface of the substrate; and
   a second electrode spaced from the first electrode by an air gap, the second electrode comprising a free-standing thin film consisting of one single layer of an alloy of aluminum and at least magnesium, wherein the magnesium content is between 0.1 and 10 atomic weight percent.

2. The MEMS device as claimed in claim 1, wherein the alloy comprises an alloy of aluminum, magnesium and at least one further material.

3. The MEMS device as claimed in claim 2, wherein said at least one further material comprises one or more of copper, manganese, silicon, nickel, chromium, and lithium.

4. The MEMS device as claimed in claim 3, wherein said one further material comprises copper in an amount between 0.1 and 8 atomic weight percent.

5. The MEMS device as claimed in claim 3, wherein the sum of the contents of magnesium, copper and manganese is between 2.5 and 10 atomic weight percent.

6. The MEMS device as claimed in claim 3, wherein the alloy comprises an alloy selected from the group consisting of $Al_vMg_wCu_xMn_y$, $Al_vMg_wMn_y$, $Al_vMg_wCu_xSi_{z1}Ni_{z2}$, $Al_vMg_wCu_x$, $Al_vMg_wCu_xSi_{z1}$, $Al_vMg_wCu_xZn_{z3}Cr_{z4}$, $Al_vMg_wCu_xLi_{z5}$, with $80 \leq v \leq 99.8$; and $0.1 \leq w \leq 8.0$, $0.1 \leq x \leq 8.0$, $0.1 \leq y \leq 4.0$ and $z1, z2, z3, z4, z5$ each smaller than 20.

7. A MEMS device as claimed in claim 6, wherein $z1$, $z2$, $z3$, $z4$, $z5$ are each smaller than 5.

8. A MEMS device as claimed in claim 1, wherein the substrate comprises a body and an insulating layer over the body, the first electrode formed over a surface of the insulating layer, wherein the first electrode is embedded in a passive network that comprises additional components.

9. A MEMS device as claimed in claim 1, further comprising a thin film capacitor at a surface of the substrate and laterally spaced from the first electrode.

10. A method of manufacturing a MEMS device, the method comprising: forming a first electrode at an upper surface of a substrate, and forming a second electrode spaced from the first electrode by an air gap, the second electrode comprising a free standing thin film, the thin film consisting of one single layer of an alloy of aluminum and at least magnesium, wherein the magnesium content is between 0.1 and 10 atomic weight percent.

11. The method as claimed in claim 10, wherein manufacturing the MEMS device comprises:
   providing a mechanical layer of material on a sacrificial release layer;
   structuring said mechanical layer to define the film; and
   removing said release layer to render said film free-standing, wherein the film comprises the alloy of aluminum and at least magnesium.

12. The method according to claim 11, wherein said release layer is patterned prior to provision of said mechanical layer thereon.

13. The method as claimed in claim 11, wherein the alloy comprises an alloy of aluminum, magnesium and at least one further material.

14. The method as claimed in claim 13, wherein the at least one further material comprises one or more of copper, manganese, silicon, nickel, chromium, and lithium.

15. A method as claimed in claim 14, wherein the one further material comprises copper in an amount between 0.1 and 8 atomic weight percent.

16. A method as claimed in claim 14, wherein the sum of the contents of magnesium, copper and manganese is between 2.5 and 10 atomic weight percent.

17. A method as claimed in claim 14, wherein the alloy comprises an alloy selected from the group consisting of $Al_vMg_wCu_xMn_y$, $Al_vMg_wMn_y$, $Al_vMg_wCu_xSi_{z1}Ni_{z2}$, $Al_vMg_wCu_x$, $Al_vMg_wCu_xSi_{z1}$, $Al_vMg_wCu_xZn_{z3}Cr_{z4}$, $Al_vMg_wCu_xLi_{z5}$, with $80 \leq v \leq 99.8$; and $0.1 \leq w \leq 8.0$, $0.1 \leq x \leq 8.0$, $0.1 \leq y \leq 4.0$ and $z1, z2, z3, z4, z5$ each smaller than 20.

18. The MEMS device as claimed in claim 11, wherein the Mg content is between 0.1 and 10 atomic weight percent.

* * * * *

UNITED STATES PATENT AND TRADEMARK OFFICE
CERTIFICATE OF CORRECTION

PATENT NO. : 8,367,215 B2 Page 1 of 1
APPLICATION NO. : 10/578027
DATED : February 5, 2013
INVENTOR(S) : Den Toonder et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1750 days.

Signed and Sealed this
First Day of September, 2015

Michelle K. Lee
*Director of the United States Patent and Trademark Office*